United States Patent
Weaver et al.

(10) Patent No.: US 7,012,363 B2
(45) Date of Patent: Mar. 14, 2006

(54) OLEDS HAVING INCREASED EXTERNAL ELECTROLUMINESCENCE QUANTUM EFFICIENCIES

(75) Inventors: Michael Stuart Weaver, Princeton, NJ (US); Vladimir Bulovic, Lexington, MA (US); Min-Hao Michael Lu, Lawrenceville, NJ (US)

(73) Assignee: Universal Display Corporation, Ewing, NJ (US)

( * ) Notice: Subject to any disclaimer, the term of this patent is extended or adjusted under 35 U.S.C. 154(b) by 287 days.

(21) Appl. No.: 10/043,849

(22) Filed: Jan. 10, 2002

(65) Prior Publication Data
US 2003/0127973 A1    Jul. 10, 2003

(51) Int. Cl.
H05B 33/00     (2006.01)
(52) U.S. Cl. ...................... 313/504; 313/506
(58) Field of Classification Search ........ 313/498–502, 313/504, 506, 507, 509, 511, 512; 428/690, 428/917; 315/169.3
See application file for complete search history.

(56) References Cited

U.S. PATENT DOCUMENTS

| | | | |
|---|---|---|---|
| 4,816,717 A * | 3/1989 | Harper et al. ............... | 313/502 |
| 4,842,893 A | 6/1989 | Yializis et al. .............. | 427/44 |
| 4,849,296 A * | 7/1989 | Haluska et al. ............. | 428/457 |
| 4,954,371 A | 9/1990 | Yializis ........................ | 427/44 |
| 5,260,095 A | 11/1993 | Affinito ...................... | 427/124 |
| 5,371,434 A | 12/1994 | Rawlings .................... | 313/506 |
| 5,618,626 A | 4/1997 | Nagashima et al. ........ | 428/429 |
| 5,707,745 A | 1/1998 | Forrest et al. .............. | 428/432 |
| 5,757,126 A | 5/1998 | Harvey, III et al. ........ | 313/506 |
| 5,814,416 A | 9/1998 | Dodabalapur et al. ...... | 428/690 |
| 5,834,893 A | 11/1998 | Bulovic et al. ............. | 313/506 |
| 5,936,345 A * | 8/1999 | Hora ........................... | 313/506 |
| 5,936,347 A | 8/1999 | Isaka et al. ................. | 313/509 |

(Continued)

FOREIGN PATENT DOCUMENTS

EP     1 116 987 A2     7/2001

(Continued)

OTHER PUBLICATIONS

"CRM-Barium Titanate (BaTiO3) evaporation material", http://www.china-raremetal.com/product/Barium%20%20Titanate%20(BaTiO3).htm.*

(Continued)

*Primary Examiner*—Joseph Williams
(74) *Attorney, Agent, or Firm*—Mayer & Williams PC; David B. Bonham, Esq.

(57) ABSTRACT

OLED devices are disclosed having increased external electroluminescence quantum efficiencies, i.e., increased "out-coupling" efficiencies. OLED devices that have increased out-coupling efficiencies and that are also protected from environmental elements such as moisture and oxygen are also disclosed. The OLED device of the present invention comprises a substrate; an active region positioned on the substrate, wherein the active region comprises an anode layer, a cathode layer and a light-emitting layer disposed between the anode layer and the cathode layer; and a polymeric layer disposed (a) over the active region, (b) under the active region or (c) both over and under the active region. The polymeric layer has microparticles incorporated therein, and the microparticles are effective to increase the out-coupling efficiency of the OLED. In one embodiment, the OLED device comprises a composite barrier layer and the microparticles are incorporated in a polymeric planarizing sublayer of the composite barrier layer. The composite barrier layer in this embodiment also protects the OLED from damage caused by environmental elements such as moisture and/or oxygen.

30 Claims, 3 Drawing Sheets

U.S. PATENT DOCUMENTS

| | | | |
|---|---|---|---|
| 5,955,837 A * | 9/1999 | Horikx et al. | 313/506 |
| 6,125,226 A | 9/2000 | Forrest et al. | 385/131 |
| 6,146,225 A | 11/2000 | Sheats et al. | 445/24 |
| 6,224,948 B1 | 5/2001 | Affinito | 427/488 |
| 6,268,295 B1 | 7/2001 | Ohta et al. | 438/735 |
| 6,268,695 B1 | 7/2001 | Affinito | 313/504 |
| 6,339,289 B1 * | 1/2002 | Fork | 313/506 |
| 2001/0033135 A1 * | 10/2001 | Duggal et al. | 313/506 |

FOREIGN PATENT DOCUMENTS

| | | |
|---|---|---|
| WO | WO 98/17083 | 4/1998 |
| WO | WO 00/26973 | 5/2000 |
| WO | WO 00/36665 | 6/2000 |
| WO | WO 00/76008 A1 | 12/2000 |
| WO | WO 01/33598 | 5/2001 |
| WO | WO 01/33598 A1 | 5/2001 |
| WO | WO 02/37580 A1 | 5/2002 |

OTHER PUBLICATIONS

"The Mineral Rutile", http://mineral.galleries.com/minerals/oxides/rutile/rutile.htm.*

GMELIN database search, 4 pages.*

CRC Materials Science and Engineering Handbook, Third Edition 2001, Tables 304 and 306.*

Takashi Yamasaki et al., "Organic light-emitting device with an ordered monolayer of silica microspheres as a scattering medium," Appl. Phys. Lett., vol. 76, No. 10, Mar. 6, 2000, pp. 1243-1245.

Tetsuo Tsutsui et al., "Doubling Coupling-Out Efficiency in Organic Ligh-Emitting Devices Using a Thin Silica Aerogel Layer," Adv. Mater., vol. 13, No. 15, Aug. 3, 2001, pp. 1149-1152.

H. Yokogawa et al., " New Transparent Substrate with Silica Aerogel Film for Surface-Emissive Devices," Mat. Res. Soc. Symp. Proc., vol. 660, 2001, pp. JJ5.19.1-JJ5.19.6.

A.N.Safonov et al., "Modification of Polymer Light Emission BY Lateral Microstructure," Synthetic Metals 116 (2001), pp. 145-148.

G. Gu et al., " High-External-Quantaum-Efficiency Organic Light-Emitting Devices," Optics Letters, vol. 22, No. 6, Martch 15, 1997, pp. 396-398.

V. Bulovic et al., " Weak Microcavity Effets In Orgnic Light-Emitting Devices," Physical Review B. vol. 58, No. 7, Aug. 15, 1998, pp. 3730-3740.

Benjamin J. Matterson et al., "Increased Efficiency and Controlled Light Output From A Microstructured Light-Emitting Diode," Adv. Mater. vol. 13, No. 2, Jan. 16, 2001, pp. 123-127.

Dan Daly et al., "Little Lenses, Major Markets," Photonics Spectra, Jul. 2001, pp. 120-122.

C.F. Madigan et al., "Improvement of Output Coupling Efficiency of organic Light-Emitting Diodes by Backside Substrate Modification," Appl. Phys. Lett., vol. 76, No. 13, Mar. 27, 2000, pp. 1650-1652.

Paul C.K. Kwok et al., "Designing an External Efficient of Over 30% for Light Emitting Diode," IEEE Lasers and Electro-Optics Society 1998 Annual Meeting, Conference Proceedings, vol. 1, pp. 187-188.

Takashi Yamasaki et al., "Organic Light Emitting Devices with a Periodic Dielectric Structure as a Scattering Media," IEEE Lasers and Electro-Optics Society 1998 Annual Meeting, Conference Proceedings, vol. 1, pp. 189-190.

Takashi Yamasaki et al., "Organic Light-Emitting Device with an Ordered Monolayer of Silica Microspheres as a Scattering Medium," Applied Physics Letters, vol. 76, No. 10, Mar. 2000, pp. 1243-1245.

V. Bulovic et al., "Weak Microcavity Effects in Organic Light-Emitting Devices," Physical Review B, vol. 58, No. 7, Aug. 15, 1998, pp. 3730-3740.

H. Yokogawa et al., "New Transparent Substrate with Silica Aerogel Film for Surface-Emissive Devices," Materials Research Society Symposia Proceedings, vol., 660, pp. JJ519.1-JJ519.6.

Dan Daly et al., "Little Lenses, Major Markets: Microlens Arrays Provide Optical Versatility in a Miniature Package for Communications, Display, and Imaging Application," Photonics Spectra, Jul. 2001, pp. 120-122.

A. N. Safonov et al., "Modification of Polymer Light Emission by Lateral Microstructure," Synthetic Metals, vol. 116, 2001, pp. 145-148.

Benjamin J. Matterson et al., "Increased Efficiency and Controlled Light Output from a Microstructured Light-Emitting Diode," Advanced Materials, vol. 13, No. 2, Jan. 16, 2001, pp. 123-127.

G. Gu et al., "High-External-Quantum-Efficiency Organic Light-Emitting Devices," Optics Letters, vol. 22, No. 6 Mar. 15, 1997, pp. 396-398.

C. F. Madigan et al., "Improvement of Output Coupling Efficiency of Organic Light-Emitting Diodes by Backside Substrate Modification," Applied Physics Letters, vol., 76, No. 13, Mar. 27, 2000, pp. 1650-1652.

* cited by examiner

OLEDS HAVING INCREASED EXTERNAL ELECTROLUMINESCENCE QUANTUM EFFICIENCIES

FIELD OF THE INVENTION

The present invention relates to organic optoelectronic devices, more particularly to organic light emitting devices (OLEDs) having increased external electroluminescence (EL) quantum efficiencies or "out-coupling" efficiencies. OLEDs having increased out-coupling efficiencies and that are protected from environmental elements such as moisture and or oxygen are also disclosed.

BACKGROUND OF THE INVENTION

Organic light emitting devices ("OLEDs"), including both polymer and small-molecule OLEDs, are potential candidates for a great variety of virtual- and direct-view type displays, such as lap-top computers, televisions, digital watches, telephones, pagers, cellular telephones, calculators and the like. Unlike inorganic semiconductor light emitting devices, organic light emitting devices are generally simple and are relatively easy and inexpensive to fabricate. Also, OLEDs readily lend themselves to applications requiring a wide variety of colors and to applications that concern large-area devices.

OLEDs generate light when an electron and a hole combine in a light-emitting layer in the OLED to generate a photon. The percentage of combined electrons and holes that result in generation of a photon in the light-emitting layer is referred to as the "internal electroluminescence quantum efficiency." The percentage of generated photons that are transmitted or "coupled" out of the device is referred to as the "external electroluminescence quantum efficiency" or the "out-coupling" efficiency of the device. Some models predict that only about 20% or less of the generated photons are transmitted out of the device. It is believed that this is at least in part due to the fact that the generated photons are trapped within the OLED device structure by internal reflection at interfaces within the OLED, resulting in waveguiding of the photons within the OLED and absorption of the trapped photons by the OLED. Absorption can occur within any part of the OLED device, such as within an ITO anode layer or within the substrate, where the refractive index of that particular part is greater than the refractive indices of the adjacent parts. Waveguided photons that are not absorbed by the device itself can also be directed out of the edges of the device. These phenomena result in decreased external electroluminescence quantum efficiency and a reduction in the luminescence or brightness in directions extending outwardly from the surface of the device.

Approaches have been advanced to increase the out-coupling efficiency of OLEDs. For example, Yamasaki et al., "Organic light-emitting device with an ordered monolayer of silica microspheres as a scattering medium," *Appl. Phys. Lett.*, Vol. 76, No. 10 (March 2000), incorporated in its entirety herein by reference, discloses providing an OLED with an ordered monolayer of silica microspheres. Yamaski et al. disclose that the silica microspheres, placed as a hexagonal close-packed array on a top or bottom surface of a glass substrate, behaved as a light scattering medium for light propagated in waveguiding modes within the OLED. Some of the light scattered by the microspheres was transmitted out of the device, increasing the out-coupling efficiency of the OLED.

In another approach, Tsutsui et al., "Doubling Coupling-Out Efficiency in Organic Light-Emitting Devices Using a Thin Silica Aerogel Layer," *Adv. Mater.*, Vol. 13, No. 15 (August 2001), disclose providing an OLED with a thin silica aerogel layer of refractive index less than 1.03 positioned between an emissive layer and a glass substrate. The external quantum efficiency of an OLED constructed in this manner, as reported by Tsutsui et al., was 1.39% as compared to 0.765% (equating to an "enhancement factor" of about 1.8) for a similar device not provided with the thin silica aerogel layer.

Another factor limiting the practical application of OLEDs is their susceptibility to environmental elements such as moisture and oxygen. Oxygen and moisture can produce deleterious effects on certain OLED structural components, such as reactive metal cathode components. Without protection, the lifetime of the devices can be severely limited. For example, moisture and oxygen are known to increase "dark spot areas" in connection with OLED structures. The organic materials utilized in a conventional OLED structure can also be adversely affected by environmental species such as water and oxygen. Approaches to protecting OLEDs from environmental elements include, as discussed below, providing the OLED with a protective layer or cover that resists permeation by moisture and/or oxygen.

In general, two-dimensional OLED arrays for imaging applications are known in the art and typically include an OLED display area that contains a plurality of active regions or pixels arranged in rows and columns. FIGS. 1A and 1B are simplified schematic representations (cross-sectional views) of OLED structures of the prior art. The OLED structure shown in FIG. 1A includes a single active region 15 which includes an electrode region such as anode region 12, a light emitting region 14 over the anode region 12, and another electrode region such as cathode region 16 over the light emitting region 14. The active region 15 is disposed on a substrate 10. Barrier layer 20 disposed over active region 15 is provided to restrict transmission of oxygen and water vapor from an outer environment to the active pixel 15.

It is known to provide a barrier layer as a multilayer structure comprising an alternating series of one or more polymeric "planarizing" sublayers and one or more "high density" sublayers of inorganic or dielectric material.

The polymer multilayer ("PML") process is advantageous because it is a vacuum compatible process which produces a conformal coating that does not require the separate attachment of a preformed cover for protecting an OLED from environmental elements. Moreover, the PML process produces a composite barrier layer with good resistance to moisture and oxygen penetration. A PML composite barrier layer can also be disposed on any surface of a substrate, such as between a top surface of the substrate and the active region. The use of a PML composite barrier layer disposed on a substrate is particularly advantageous when the substrate is permeable to oxygen and moisture, as is often the case with polymeric substrates used in constructing flexible OLEDs (FOLEDs). As the name suggests, these structures are flexible in nature. Examples of OLEDs protected with PML composite barrier layers are disclosed in, for example, U.S. Pat. Nos. 5,757,126, 6,146,225 and 6,268,295 all of which are incorporated herein in their entireties.

In one common OLED structure such as shown in FIG. 1A, light from the light emitting layer 14 is transmitted downwardly through the substrate 10. In such a "bottom-emitting" configuration, the substrate 10 and anode 12 are formed of transparent materials. The cathode 16 and barrier layer 20 need not be transparent in this configuration. Moreover, structures are also known in which the positions of the anode 12 and cathode 16 in FIG. 1A are switched as illustrated in FIG. 1B. Such devices are sometimes referred to as "inverted OLEDs". In such an inverted OLED bottom-emitting configuration as illustrated in FIG. 1B, the cathode 16 and substrate 10 are formed of transparent materials.

However, other OLED architectures are also known in the art, including "top-emitting" OLEDs and transparent OLEDs (or "TOLEDs"). For top-emitting OLEDs, light from the light emitting layer 14 is transmitted upwardly through barrier layer 20. In a top-emitting configuration based on a design like that shown in FIG. 1A, the cathode 16 and barrier layer 20 are formed of transparent materials while the substrate 10 and anode 12 need not be transparent. In an inverted top-emitting OLED configuration based on a design like that shown in FIG. 1B, the anode 12 and barrier layer 20 are formed of transparent materials. In this configuration, the cathode 16 and substrate 10 need not be transparent.

For TOLEDs, in which light is emitted from both the top and bottom of the device, the substrate 10, anode 12, cathode 16 and barrier layer 20 are formed of transparent materials. TOLEDs can be based on a configuration such as that shown in either FIG. 1A or FIG. 1B.

SUMMARY OF THE INVENTION

In accordance with the foregoing, it would be desirable to provide an OLED device that has an increased out-coupling efficiency resulting in a more luminous display constructed with such an OLED device. It would further be desirable to provide an OLED device that has an increased out-coupling efficiency and that is also protected from oxygen and moisture through the use of a PML composite barrier layer that provides a conformal coating for an OLED fabricated on a substrate.

These and other challenges are addressed by the present invention which provides (a) a substrate; (b) an active region positioned on the substrate, wherein the active region comprises an anode layer, a cathode layer and a light-emitting layer disposed between the anode layer and the cathode layer; and (c) a polymeric layer disposed (1) over the active region, (2) under the active region or (3) both over and under the active region. The polymeric layer has microparticles incorporated therein, and the microparticles are effective to increase the out-coupling efficiency of the OLED. In a preferred embodiment of the present invention, the OLED is provided with a composite barrier layer disposed over the active region and/or on a surface of the substrate. The composite barrier layer comprises an alternating series of one or more polymeric planarizing sublayers and one or more high-density sublayers. The microparticles are incorporated within at least one of the polymeric planarizing sublayers. In some preferred embodiments, the microparticles are incorporated within a polymeric planarizing sublayer closest to the active region. In other preferred embodiments, the microparticles are incorporated within a polymeric planarizing sublayer closest to the substrate. The microparticles are preferably comprised of a transparent material, preferably an inorganic material such as a metal, metal oxide, e.g., $TiO_2$, or other ceramic material having a relatively high index of refraction, Preferably, the microparticles will have an index of refraction of greater than about 1.7. The microparticles are preferably substantially smaller than the largest dimension of any active region or pixel in a display comprising an OLED device of the invention. The microparticles preferably will have a size greater than the wavelength, $\lambda$, of light generated by the OLED. Thus, the microparticles will preferably have a particle size greater than about 0.4 $\mu$m–0.7 $\mu$m. The microparticles will preferably have a size in the range of from about 0.4 $\mu$m to about 10 $\mu$m or greater. Representative OLEDs in accordance with the present invention are flexible OLEDs, particularly bottom-emitting flexible OLEDs in which the substrate and contacting electrode are both flexible and transparent. Other OLED configurations such as top-emitting and both top- and bottom-emitting OLEDs are included within the scope of the present invention. Such other OLED configurations may be flexible OLEDs. Preferred substrate materials include ceramic materials such as glasses and polymeric materials.

These and other embodiments and advantages of the present invention will become readily apparent to those of ordinary skill in the art upon review of the disclosure to follow.

As is typically the case with such figures, the above are simplified schematic representations presented for purposes of illustration only, and the actual structures may differ in numerous respects, particularly including the relative scale of the components.

DETAILED DESCRIPTION OF THE INVENTION

The present invention now will be described more fully hereinafter with reference to the accompanying drawings in which preferred embodiments of the invention are shown. This invention may, however, be embodied in different forms and should not be construed as limited to the embodiments set forth herein.

As used herein, a "layer" of a given material includes a region of that material whose thickness is small compared to both its length and width. Examples of layers include sheets, foils, films, laminations, coatings, and so forth. As used herein a layer need not be planar, but can be bent, folded or otherwise contoured, for example, to at least partially envelop another component. As used herein a layer can also include multiple sub-layers. A layer can also consist of a collection of discrete portions, for example, a layer of discrete active regions comprising individual pixels.

The present invention is directed to an OLED device comprising: (a) a substrate; (b) an active region positioned over the substrate, wherein the active region comprises an anode layer, a cathode layer and a light-emitting layer disposed between the anode layer and the cathode layer; and (c) a polymeric layer having microparticles incorporated therein such that the microparticles are effective to increase the out-coupling efficiency of the OLED.

Figure 1A:
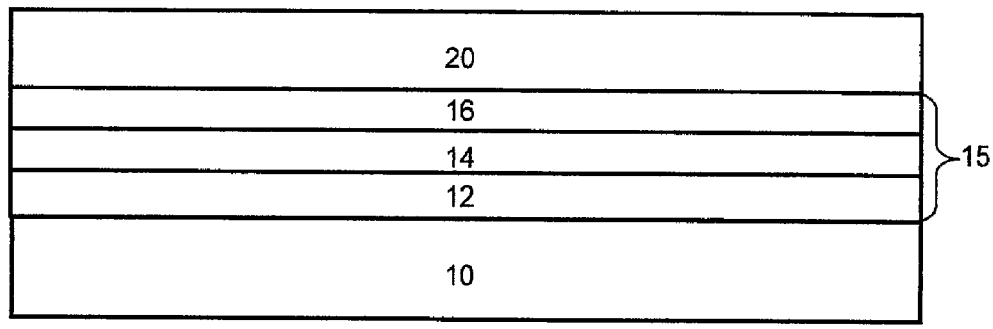
FIGS. 1A and 1B are simplified schematic representations (cross-sectional views) of OLED structures provided with an active region between a barrier layer and a substrate.
Figure 1B:
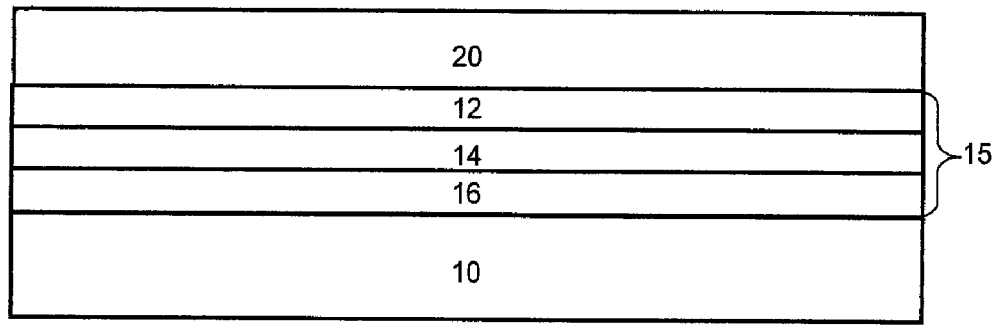
Figure 2:
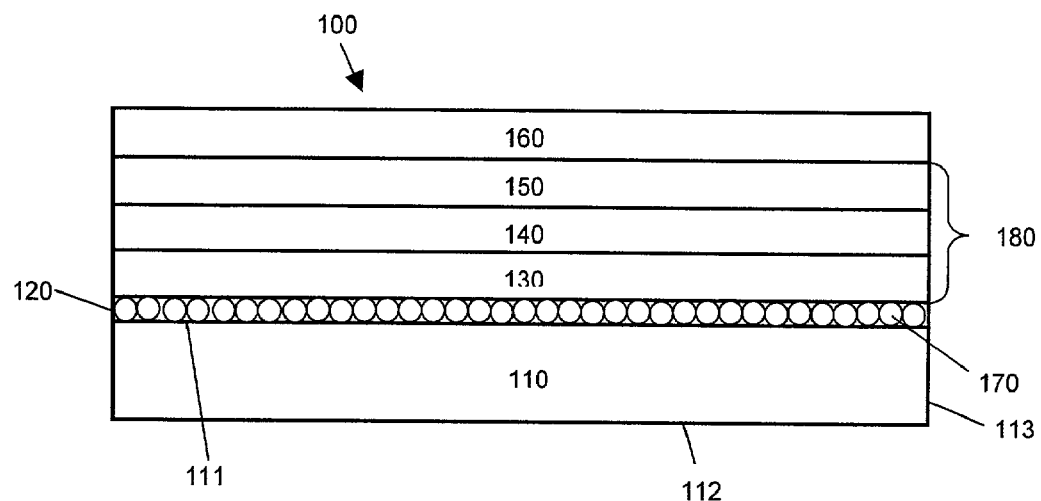
FIG. 2 is a simplified schematic representation (cross-sectional view) of an OLED structure in accordance with the present invention.

FIG. 2 is a simplified schematic representation (cross-sectional view) of device 100 constructed in accordance with the present invention. Device 100 comprises substrate 110, polymeric layer 120 having microparticles 170 incorporated therein, anode layer 130, cathode layer 150, light-emitting layer 140 (positioned between anode layer 130 and cathode layer 150) and cover region 160. Collectively, anode layer 130, light emitting layer 140 and cathode layer 150 form active region 180. Active region 180 may form a single pixel. Alternatively, multiple similar active regions 180, laterally spaced from each other, may be constructed on a single substrate 110, to form a display area comprising multiple individual pixels.

In the embodiment shown in FIG. 2, polymeric layer 120 having microparticles incorporated therein is disposed on a top surface 111 of substrate 110, between substrate 110 and active region 180. A polymeric layer 120 may also be disposed on a bottom surface 112 or a side surface 113 of substrate 120. Where a polymeric layer 120 is disposed on all surfaces of substrate 110, polymeric layer 120 will encapsulate substrate 110. Microparticles 170 are shown in device 100 as positioned in the polymeric layer 120 between substrate 110 and anode 130. However, microparticles 120 may be incorporated within any portion of a polymeric layer 120 disposed on any surface of substrate 110. In some embodiments, for example, it may be desirable to incorporate microparticles 170 within portions of polymeric layer 120 disposed on a bottom surface of substrate 110.

Hence, it is understood that the microparticles need not be incorporated into every portion of a polymeric layer 120. For example, where the polymeric layer 120 encapsulates the substrate, it may be desirable to incorporate the microparticles into only that portion of the polymeric layer that is disposed between the substrate and the active region as shown in FIG. 2, or only in that portion of the polymeric layer that is disposed on a bottom surface of the substrate. Similarly, where the polymeric layer is disposed over the active region (see below), it may be desirable to incorporate the microparticles into only that portion of the polymeric layer that is disposed over the active region. Of course, a device in accordance the present invention may be provided with any combination of these possible locations of the microparticles in the polymeric layer.

Polymeric layer 120, in addition to acting as a medium in which microparticles 170 are incorporated, may also be selected to provide substantial protection against penetration of environmental elements such as moisture and oxygen through substrate 110. Such protection may be enhanced when substrate 110 is, as discussed above, encapsulated by polymeric layer 120.

Polymeric layer 120 containing microparticles 170 may also be disposed over active region 180. In such embodiments, polymeric layer 120 may be provided as a coating layer contacting cathode 150. Incorporating microparticles into a polymeric layer disposed over an active region may be particularly advantageous for top-emitting OLEDs or for transparent OLEDs that are both top-emitting and bottom emitting (i.e., TOLEDs). In other embodiments, it may be desirable to dispose polymeric layer 120 having microparticles 170 incorporated therein on both a top or other surface of substrate 110, as shown in FIG. 2, and as well as over active region 180. This construction may be particularly advantageous for TOLEDs. Polymeric layer 120, when disposed over active region 180, may also be selected to provide substantial protection from penetration of environmental elements such as moisture and oxygen into any of the layers comprising active region 180.

Without being bound by theory, it is believed that microparticles increase the out-coupling efficiency of light generated within a light-emitting layer by scattering light generated from the light-emitting layer and, thereby, decreasing the propensity for the light to be confined within any portion or distinct layer of the device due to internal reflections and, thereafter being absorbed within the device or transmitted out of the edges of the device. It is also believed that the microparticles may act as miniature lenses that preferentially direct the generated light out of and normal to a surface of the device. The waveguiding of generated light is particularly problematic at interfaces where light emitted from the active region of the OLED encounters a decrease in refractive index, such as the interfaces between, for example, a light emitting layer and an adjacent electrode layer such as a transparent ITO anode layer, at an interface between a transparent electrode layer and an adjacent transparent substrate, and at an interface between a transparent substrate and air. Therefore, in some preferred embodiments, it may be most advantageous to incorporate a polymeric layer containing microparticles at an interface between these otherwise adjacent layers. Moreover, it is also preferred to situate the polymeric layer containing microparticles as close to the light-emitting active region as possible.

The OLED device shown in FIG. 2 may, as described hereinabove, be a top-emitting, bottom-emitting or transparent OLED (TOLED) and the positions of the anode and cathode may be reversed to form an inverted OLED structure. In preferred embodiments, the device shown in FIG. 2, is a bottom-emitting OLED in which case the anode 130, substrate 110 and polymeric layer 120 having microparticles incorporated therein are transparent.

The substrate used in any embodiment of the present invention may be any substrate conventionally used for establishing an OLED active region thereon. Thus, the substrate may comprise an inorganic material or an organic material, may be transparent or opaque (depending on the particular OLED configuration) and may be flexible or relatively rigid.

The materials selected for the substrate will depend upon the application at hand. Metals offer excellent barrier properties. Preferred metals include aluminum, gold, nickel, nickel alloys and indium, as well as other metals known in the art.

Semiconductors such as silicon offer good barrier properties to water, oxygen and other harmful species and also provide a substrate upon which electronic circuitry can be built.

Ceramics also offer low permeability and provide transparency in some cases. Preferred ceramics are glasses, more preferably soda lime and borosilicate glasses. Glasses, although relatively rigid, are useful for bottom-emitting OLEDs and TOLEDs, which require a transparent substrate.

Polymers are often preferred where optical transparency is desired or where ease of continuous manufacture (e.g., web-based manufacture) is desired. Polymers are particularly preferred substrate materials for flexible OLEDS (or "FOLEDS").

Preferred low permeability polymers include polyesters, polyethersulphones, polyimides and fluorocarbons. Preferred polyesters include polyethylene terephthalate. Preferred fluorocarbon polymers include Aclar® fluoropolymer available from Honeywell. Where the substrate is polymeric material, it typically ranges from 75 to 625 microns in thickness.

As with substrate 110, the cover region 160 used in the present invention may be any cover region conventionally used for effectively sealing the OLED active region. Thus, the cover region 160 may comprise an inorganic material or an organic material, may be transparent or opaque (depending on the particular OLED configuration) and may be flexible or relatively rigid. The materials selected for the cover will depend upon the application at hand, and include the various metals, semiconductors, ceramics and polymers described above with reference to the substrate. Moreover, as discussed further herein, the cover region 160 can comprise a composite barrier region.

Polymeric layer 120 having microparticles 170 incorporated therein may comprise any polymeric material known in the art for coating a substrate or active region. Among useful polymeric materials are those conventionally used, as described more fully below, as polymeric planarizing materials for forming sublayers in a composite barrier layer formed, for example, by a polymer multilayer (PML) process. Among preferred planarizing materials include polymers, such as fluorinated polymers, parylenes, cyclotenes and polyacrylates. A device in accordance with the present invention may comprise multiple polymeric layers, at least one of which has incorporated therein microparticles.

Microparticles useful in any embodiment of the present invention, may comprise irregularly or regularly shaped particles. Generally spherically shaped microparticles, or "microspheres," are an example of regularly shaped microparticles useful in the present invention. Thus, while the drawings appended hereto depict generally spherically shaped microparticles, it is understood that the present invention is not to be construed as limited to generally spherically shaped microparticles. The microparticles are preferably formed from a transparent inorganic or polymeric material. Microparticles may, therefore, comprise metals, metal oxides such as $TiO_2$ or other ceramic materials having a relatively high index of refraction, Preferably, the microparticles will have an index of refraction of greater than about 1.7. The size of the microparticles is preferably substantially smaller than a smallest lateral dimension of a pixel on a display area and more preferably at least 10 times smaller than the smallest lateral dimension of the pixel. Preferably, the microparticles will have a size greater than the wavelength, $\lambda$, of light generated by the OLED. Thus, the microparticles will preferably have a size greater than from about 0.4 $\mu$m to about 0.7 $\mu$m. Generally, the microparticles will have sizes within the range of from 0.4 $\mu$m to about 10 $\mu$m. Thus, with reference to FIG. 2, active region 180 may comprise a single pixel, and the size of microparticles 170 is smaller than the pixel. Hence, multiple microparticles 170 will be incorporated within the portion of polymeric layer 120 disposed, as shown in FIG. 2, between active region 180 and substrate 110. In preferred embodiments of the present invention, the smallest lateral dimension of a pixel will range from about 10 $\mu$m to about 300 $\mu$m and the average size of the microparticles will range from about 0.4 $\mu$m to about 10 $\mu$m. It is understood that, within the foregoing parameters, microparticles within any single polymeric layer or polymeric planarizing sublayer, may have a range of sizes. Thus, the size ranges mentioned above represent average microparticle sizes.

The refractive index of the microparticles should preferably be different from the refractive index of the polymeric material within which the microparticles are incorporated. The difference, $\Delta n$, between the refractive index of the microparticles and the polymeric material within which the microparticles are incorporated is preferably about 0.3 or greater. In some preferred embodiments, the refractive index of the microparticles is about 1.7 or greater.

The microparticles may be incorporated or distributed within the polymeric layer in a random fashion or as an ordered arrangement, for example, as a hexagonally close-packed array. Regardless of whether the microparticles are randomly distributed or provided as ordered array, it is preferred that the microparticles be closely packed within any polymeric layer or polymeric planarizing sublayer. Close packing of the microparticles may increase the propensity for the scattering and/or lensing effects discussed above and the consequent decrease in waveguiding, absorption and edge losses of the light generated within an OLED device. As discussed above, the microparticles are incorporated within a polymeric layer or polymeric planarizing sublayer. By "incorporated" is meant that a least a portion of a microparticle surface is contacted by the material comprising the layer in which the microparticles are incorporated. Thus, the microparticles can be partially or completely embedded within the polymeric layer or polymeric planarizing sublayer.

Again with reference to FIG. 2, polymeric layer 120 having microparticles incorporated therein can be disposed on any surface of substrate 110 and/or over active region 180 (not shown) by suitable adaptation of any polymer coating methods known to those skilled in the art. For example, microparticles may be incorporated into a solution of a polymeric material or a dispersion of a polymeric material in a carrier liquid and applying the solution or dispersion onto the surface of the substrate and/or over the active region followed by evaporation of the solvent or carrier liquid. The solution or dispersion may be applied, for example, by spraying onto the OLED device or a portion thereof or by dipping the OLED device or a portion thereof into the solution or dispersion. The microparticles need not be incorporated into the polymer solution or dispersion prior to its application and, therefore, may be incorporated subsequent to application of the polymeric material. Other methods may also be adapted to provide polymeric layer 120 having microparticles incorporated therein. Such methods include, but are not limited to, spin coating, sputter deposition, thermal deposition, evaporative coating, flash evaporation, chemical vapor deposition, in situ polymerization or curing of a monomer layer, and so forth. As some specific examples, the layer 221a can be established by dip coating the substrate into a container containing both polymer and microparticles, by injecting both polymer and microparticles into a hot jet spray, or by flash evaporation followed by introduction of the microparticles into the resulting polymer layer.

Figure 3:
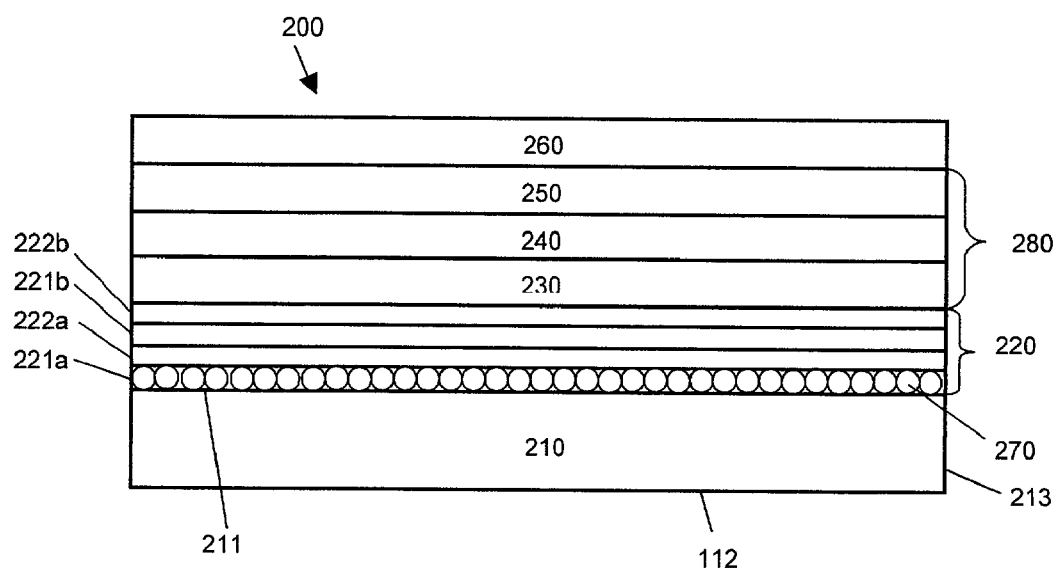
FIG. 3 is a simplified schematic representation (cross-sectional view) of another OLED structure in accordance with the present invention.

FIG. 3 is a simplified schematic representation (cross-sectional view) of device 200 constructed in accordance with another embodiment of the present invention. The embodiment shown in FIG. 3 is particularly useful in flexible OLED (FOLEDs) devices in which the active region is constructed on a flexible substrate. Device 200 comprises substrate 210, composite barrier layer 220, anode layer 230, cathode layer 250, light-emitting layer 240 (positioned between anode layer 230 and cathode layer 250) and cover region 260. Collectively, anode layer 230, light emitting layer 240 and cathode layer 250 form active region 280. As above, active region 280 may form a single pixel. Moreover, multiple similar active regions 280, spaced from each other, may be constructed on a single substrate 210, to form a display area comprising multiple individual pixels.

In the embodiment shown in FIG. 3, composite barrier layer 220 is disposed on a top surface 211 of substrate 210.

Materials appropriate for substrate 210 are discussed above. Composite barrier layer 220 comprises a plurality of cooperative barrier sub-layers that include both polymeric planarizing sublayers 221a, 221b and high-density sublayers 222a, 222b. These cooperative barrier sub-layers are preferably provided in an alternating configuration. Although FIG. 3 shows two pairs of cooperative barrier sub-layers, devices constructed in accordance with this embodiment of the present invention may be provided with from 1 to 10 pairs of these sub-layers, more preferably from 2 to 7 pairs, are used. Microparticles 270 are incorporated within polymeric planarizing sub-layer 221a, which is positioned closest to substrate 210. However, in other preferred embodiments, microparticles 270 can also be incorporated within polymeric planarizing sub-layer 221b, which is positioned closest to active region 280.

In any OLED in accordance with the present invention provided with a composite barrier layer, it is understood that microparticles 270 are incorporated within at least one polymeric planarizing sub-layer regardless of its spatial orientation in relation to the OLED active region or substrate. Moreover, where composite barrier layer 220 comprises an alternating series of two or more polymeric planarizing sub-layers and two or more high-density sub-layers, microparticles 270 may be incorporated within two or more of the polymeric planarizing sublayers. Thus, in the embodiment depicted in FIG. 3, microparticles 270 may be incorporated into both polymeric planarizing sublayers 221a and 221b.

A polymeric planarizing sublayer comprises a polymeric planarizing material that forms a smooth planar surface upon application, rather than forming a surface that reflects irregular contours of the underlying surface. Preferred thicknesses for the planarizing layers is typically 1,000 to 10,000 Å. Preferred polymeric planarizing materials include polymers such as fluorinated polymers, parylenes, cyclotenes and polyacrylates. Sub-layers of such planarizing materials 221a, 221b as shown in FIG. 3, for example, can be provided using techniques known in the art, for example, by dipping, spin coating, sputtering, evaporative coating, spraying, flash evaporation, chemical vapor deposition, in-situ polymerization or curing of a monomer layer, and so forth. Any of such methods, as described hereinabove, can be adapted to also incorporate the microparticles 270 within a planarizing sublayer of the composite barrier layer 220. Moreover, as also discussed above, microparticles may be applied together with the polymeric material or polymer-forming monomer, or incorporated within the polymeric material or monomer layer subsequent to the application thereof to the OLED device or any portion thereof.

In some preferred embodiments, the planarizing material is a polyacrylate which has a refractive index on the order of about 1.4 to 1.7. A polyacrylate polymeric planarizing sublayer may be formed, for example, by vacuum deposition of a liquid acrylic monomer onto a surface of substrate 210 and/or over active region 280. For example, a mixture of liquid acrylic monomer and microparticles can be combined and jet-sprayed onto the substrate, for example. The acrylic monomer is then polymerized or cross-linked by, for example, exposure to heat or to a radiation source such as a UV lamp. Among acrylic monomers useful for forming the polyacrylate layer are included, but not limited to, tripropyleneglycol diacrylate, tetraethylene glycol diacrylate, tripropylene glycol monoacrylate, caprolactone acrylate, and combinations thereof; methacrylic monomers; and combinations thereof.

A high-density sublayer comprises a high-density material with sufficiently close atomic spacing such that diffusion of contaminant and deleterious species, particularly water and oxygen, are hindered. Preferred thicknesses for the high-density sublayers typically range from 300 to 500 Å. Preferred high-density materials include inorganic materials such as metal oxides, metal nitrides, metal carbides and metal oxynitrides. More preferred are silicon oxides (SiOx), including silicon monoxide (SiO) and silicon dioxide ($SiO_2$), silicon nitrides (typically $Si_3N_4$), silicon oxynitrides, aluminum oxides (typically $Al_2O_3$), indium-tin oxides (ITO) and zinc indium tin oxides. Silicon nitride is most preferred, which has a refractive index on the order of about 2. Sub-layers of high-density material 222a, 222b can be applied using techniques known in the art such as thermal evaporation, sputtering, PECVD methods and electron-beam techniques.

Additional information concerning the application of the composite barrier layer to the device by the PML process is disclosed in, e.g., U.S. Pat. Nos. 4,842,893, 4,954,371, 5,260,095 and 6,224,948, each of which is incorporated by reference herein in its entirety. Other adaptations of the PML process are known in the art and may, without limitation, be used herein to form the composite barrier layer. As seen from the above, when used to form a composite barrier layer for an OLED, the PML process typically involves sequential deposition of a polymeric planarizing material followed by deposition of a high density material onto the planarizing material. For example, the deposition of a planarizing material such as a polyacrylate is described hereinabove. Moreover, a high density material is typically vacuum deposited after curing of the acrylic monomer as described hereinabove. As previously noted, the microparticles may be incorporated during application of the polymer or monomer layer or subsequent thereto.

Examples of composite barrier layers comprising sublayers of both high-density material and planarizing material formed on a polymer substrate sublayer are disclosed, for example, in U.S. Pat. No. 5,757,126, the entire disclosure of which is hereby incorporated by reference.

As noted above, the embodiment of the present invention represented in FIG. 3 is particularly suitable, but not limited to, application with flexible OLED (FOLED) devices in which the OLED active region is constructed on a flexible substrate. Flexible substrates, which are required for FOLED devices, are commonly plastics which are substantially more permeable to environmental elements such as oxygen and moisture than are typical relatively rigid substrates such as glass. Composite barrier layer 220, such as one formed by a PML process, provides effective protection from environmental species such as water and/or oxygen. Therefore, composite barrier layer 220 in device 200 is particularly desirable in flexible OLED applications since it both increases the out-coupling efficiency due to the presence of the microparticles in polymeric planarizing sublayer 221a, and protects the OLED device from the adverse effects of environmental elements such as moisture and oxygen.

In the embodiment shown in FIG. 3, composite barrier layer 220 having microparticles incorporated therein is disposed on a top surface 211 of substrate 210, between substrate 210 and active region 280. Composite barrier layer 220 may also be disposed on a bottom surface 212 or a side surface 213 of substrate 220. Where composite barrier layer 220 is disposed on all surfaces of substrate 210, composite barrier layer 220 will encapsulate substrate 210.

Microparticles 270 are shown in device 200 as positioned in a polymeric planarizing sublayer disposed between substrate 210 and high density layer 222a. However, microparticles 220 may be incorporated within any portion of a polymeric planarizing sublayer disposed anywhere between the anode 230 and the outside environment. In some embodiments, for example, it may be desirable to incorporate microparticles within portions of a polymeric planarizing sublayer disposed on a bottom surface 212 of substrate 210.

It is understood that the microparticles need not be incorporated into every portion of a polymeric planarizing sublayer of a composite barrier layer. For example, where the composite barrier layer encapsulates the substrate, it may be desirable to incorporate the microparticles into only that portion of a polymeric planarizing sublayer that is disposed between the substrate and the active region, or only in that portion of a polymeric planarizing sublayer that is disposed on a bottom surface of the substrate. Where the composite barrier layer is disposed over an active region (see below), it may be desirable to incorporate the microparticles in only in that portion of a polymeric planarizing sublayer that is disposed over the active region. Of course, a device in accordance the present invention may be provided with any combination of these possible locations of the microparticles in a polymeric planarizing sublayer.

Figure 4:
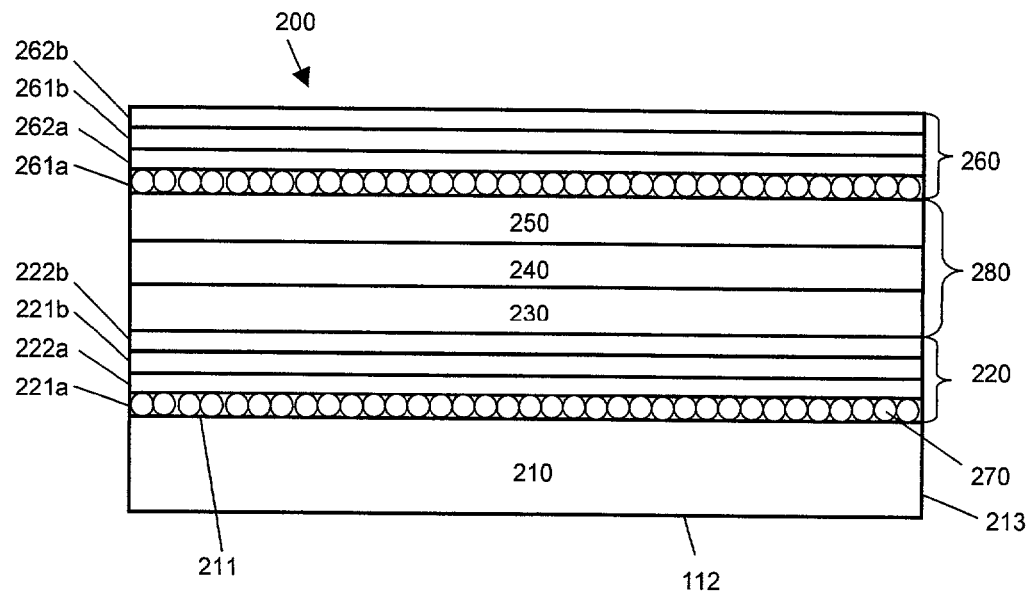
FIG. 4 is a simplified schematic representation (cross-sectional view) of another OLED structure in accordance with the present invention.

A polymeric planarizing sublayer having microparticles incorporated therein may also be disposed over the active region and, in some embodiments, also over a surface of the substrate. In such embodiments, a composite barrier layer comprising a polymeric planarizing sublayer may be provided as a coating layer over the cathode (or anode in an inverted OLED configuration). Such embodiments can be exemplified with reference to FIG. 4 in which the microparticles may be incorporated into composite barrier layer 260, which is disposed over the active region 280. The composite barrier layer 260 is like that discussed above in connection with composite barrier layer 220 and comprises, in this example, a plurality of cooperative barrier sub-layers that include both polymeric planarizing sublayers 261a, 261b and high-density sublayers 262a, 262b. Incorporation of microparticles into a polymeric planarizing sublayer of a composite barrier layer disposed over the active region may be particularly advantageous for top-emitting OLEDs or for transparent OLEDs that are both top-emitting and bottom emitting (i.e., TOLEDs).

Figure 5:
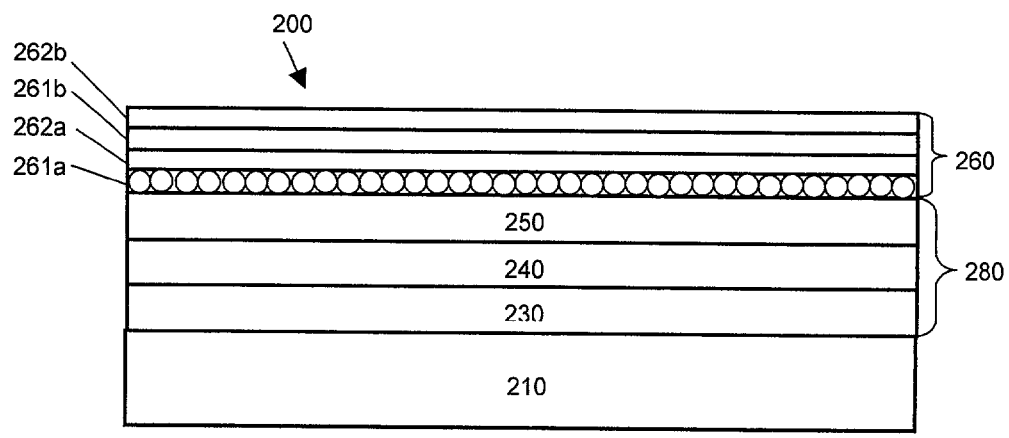
FIG. 5. is a simplified schematic representation (cross-sectional view) of another OLED structure in accordance with the present invention.

FIG. 5 depicts another embodiment of the present invention which may be particularly advantageous for use in top-emitting OLEDs. FIG. 5 is similar to the embodiment shown in FIG. 4, except that FIG. 5 shows only one composite barrier layer, 260, disposed over the active region 280. Thus, in FIG. 5, the microparticles are incorporated within polymeric planarizing sub-layer 261a which is disposed over active region 280.

In some preferred embodiments of the present invention, a first polymeric planarizing sublayer is applied over a surface of active region 280 that has been previously coated with a layer provided to protect active region 280 from damage that may otherwise be caused by direct application of the composite barrier layer onto the active region.

The active region of any OLED in accordance with the present invention can be configured in any manner known in the art. The active region of the OLED can comprise one or many active pixels, each of which typically comprises an anode layer, a cathode layer, and a light-emitting layer (emission layer) disposed between the anode and cathode layer. In any embodiment of the present invention, the positions of the anode and cathode layers may be reversed from those shown, for example, in FIGS. 2 and 3 to form an inverted OLED configuration.

Depending on the application, the anode layer in any OLED in accordance with the present invention may be transparent or opaque. Opaque anode materials include metals such as gold, chromium and magnesium/silver, while transparent anode materials include metal oxides such as indium tin oxide (ITO) and zinc tin oxide. Similarly, the cathode layer in any OLED in accordance with the present invention can be transparent or opaque depending on the application. Opaque cathode materials may include metals such as aluminum and aluminum/lithium or other materials is known in the art, while transparent cathode materials may include metal/metal oxide combinations such as Mg—Ag/ITO or other materials known in the art.

The light emitting layer of any OLED device in accordance with the present invention can be provided in connection with a number of configurations, including the following: (a) a three-layer configuration comprising a hole transporting sub-layer, an emission sub-layer and an electron transporting sub-layer (i.e., a double heterostructure configuration), (b) a two-layer configuration comprising a hole transporting sub-layer and a sub-layer that provides both emission and electron transporting functions (i.e., a single heterostructure configuration) and (c) a configuration comprising a single layer that provides hole transporting, electron transporting and emission functions (i.e., a single layer configuration). In each configuration, additional layers may also be present, for example, layers that enhance hole injection or electron injection, or layers that serve to block holes or electrons. Several structures for such devices are discussed, for example, in U.S. Pat. No. 5,707,745, the entire disclosure of which is hereby incorporated by reference. Other more complex OLED architecture is also practiced in the art and may be utilized in accordance with the present invention.

An OLED device in accordance with the present invention can also include getter protection as is known in the art. The getter regions can be formed from any getter material that reacts readily with active gases (including water and oxygen), forming stable low-vapor-pressure chemical compounds so as to remove the active gases from the gas phase. The getter region(s) provide an additional measure of protection in the event that reactive gases such as water and oxygen penetrate through any protective layer. In such event, the material of the getter regions reacts with and/or neutralizes the reactive gases before such gases can cause harm to the active region of the OLED.

Although the present invention has been described with respect to several exemplary embodiments, there are many other variations of the above-described embodiments that will be apparent to those of ordinary skill in the art. It is understood that these variations are within the teachings of the present invention, and that the invention is to be limited only by the claims appended hereto.

What is claimed is:

1. An OLED device comprising:
   (a) a substrate;
   (b) an active region positioned over said substrate, wherein said active region comprises an anode layer, a cathode layer and a light-emitting layer disposed between the anode layer and the cathode layer; and
   (c) a composite barrier layer disposed over said active region or under said active region, said composite barrier layer comprising an alternating series of one or more polymeric planarizing sublayers and one or more high-density sublayers, at least one of said polymeric planarizing sublayers having microparticles incorporated therein, said microparticles being effective to increase the out-coupling efficiency of the OLED.

2. The OLED of claim 1, wherein the substrate comprises an inorganic material or an organic material.

3. The OLED of claim 2, wherein the substrate comprises a transparent material.

4. The OLED of claim 2, wherein the substrate comprises glass, metal, or a silicon-based material.

5. The OLED of claim 2, wherein the substrate comprises a polymeric material.

6. The OLED of claim 5, wherein the substrate comprises a flexible polymeric material.

7. The OLED of claim 5, wherein the substrate comprises one or more polymeric materials selected from the group consisting of polyesters, polyolefins, polycarbonates, polyethers, polyimides and polyfluorocarbons.

8. The OLED of claim 1, wherein the polymeric sublayer having said microparticles incorporated therein is disposed on a top surface of said substrate.

9. The OLED of claim 8, wherein the substrate comprises glass or a transparent flexible polymeric material.

10. The OLED of claim 1, wherein said composite barrier layer is disposed on a top surface of said substrate.

11. The OLED of claim 10, wherein said substrate comprises glass or a transparent flexible polymeric material.

12. The OLED of claim 1, wherein said composite barrier layer comprises an alternating series of two or more polymeric planarizing sublayers and two or more high-density sublayers.

13. The OLED of claim 12, wherein said composite barrier layer is disposed over said active region.

14. The OLED of claim 12, wherein said microparticles are incorporated within at least two of said polymeric planarizing sublayers.

15. The OLED of claim 12, wherein said composite barrier layer is disposed on said substrate, and said microparticles are incorporated within a polymeric planarizing sublayer closest to said substrate.

16. The OLED of claim 12, wherein said composite barrier layer is disposed on said substrate, and said microparticles are incorporated within a polymeric planarizing sublayer closest to said active region.

17. The OLED of claim 1, wherein said composite barrier layer is disposed over said active region.

18. The OLED of claim 1, wherein the active region comprises a pixel and the size of said microparticles is smaller than the smallest lateral dimension of said pixel.

19. The OLED of claim 18, wherein the largest dimension of said pixel is from about 10 $\mu$m to about 300 $\mu$m and the size of said microparticles is from about 0.4 $\mu$m to about 10 $\mu$m.

20. The OLED of claim 1, wherein said microparticles comprise a transparent inorganic or polymeric material.

21. The OLED of claim 20, wherein said microparticles comprise glass.

22. The OLED of claim 20, wherein said microparticles comprise a metal, a metal oxide or a ceramic material.

23. The OLED of claim 22, wherein said microparticles comprise $TiO_2$.

24. The OLED of claim 1, wherein said microparticles comprise a material having a refractive index of about 1.7 or greater.

25. The OLED of claim 1, wherein the refractive index of said microparticles is different from the refractive index of said polymeric sublayer.

26. The OLED of claim 25, wherein the difference between the refractive index of said microparticles and the refractive index of said polymeric sublayer is greater than about 0.3.

27. The OLED of claim 1, wherein said polymeric planarizing sublayer comprises a material selected from the group consisting of fluorinated polymers, parylenes, cyclotenes and polyacrylates.

28. The OLED device of claim 1, wherein said high-density material is selected from the group consisting of metals, metal oxides, metal nitrides, metal carbides and metal oxynitrides.

29. The OLED device of claim 1, wherein said high-density material is selected from the group consisting of silicon, silicon oxides, silicon nitrides, silicon carbides, silicon oxynitrides, indium oxides, indium tin oxides, zinc indium tin oxides, tin oxides, aluminum oxides, aluminum nitrides, and titanium oxides.

30. The OLED device of claim 1, wherein said OLED device comprises a first composite barrier layer disposed over said active region and a second composite barrier layer disposed under said active region.

* * * * *

UNITED STATES PATENT AND TRADEMARK OFFICE
CERTIFICATE OF CORRECTION

| | |
|---|---|
| PATENT NO. | : 7,012,363 B2 |
| APPLICATION NO. | : 10/043849 |
| DATED | : March 14, 2006 |
| INVENTOR(S) | : Weaver et al. |

It is certified that error appears in the above-identified patent and that said Letters Patent is hereby corrected as shown below:

Col. 1, line 13, change first words "and or" to -- and/or --.

Col. 1, line 18, after first word "Organic" change "light emitting" to -- light-emitting --.

Col. 1, line 23, after "semiconductor" change "light emitting" to -- light-emitting --.

Col. 1, line 24, after "organic" change "light emitting" to -- light-emitting --.

Col. 1, line 63, before "medium", change "light scattering" to -- light-scattering --.

Col. 2, line 35, after "a" change "light emitting" to -- light-emitting --.

Col. 2, line 37, change first words "light emitting" to -- light-emitting --.

Col. 2, line 64, after "the" change "light emitting" to -- light-emitting --.

Col. 3, line 11, after "the" change "light emitting to -- light-emitting --.

Col. 5, line 10, after "130," change "light emitting" to -- light-emitting --.

Col. 5, line 59, change last word "bottom" to -- bottom- --.

Col. 6, line 17, change first words "light emitting" to -- light-emitting --.

Col. 8, line 7, after "as" insert -- an --.

UNITED STATES PATENT AND TRADEMARK OFFICE
CERTIFICATE OF CORRECTION

PATENT NO. : 7,012,363 B2
APPLICATION NO. : 10043849
DATED : March 14, 2006
INVENTOR(S) : Weaver et al.

It is certified that error appears in the above-identified patent and that said Letters Patent is hereby corrected as shown below:

Col. 8, line 60, after "230," change "light emitting" to -- light-emitting --.

Col. 11, line 20, delete first word "in".

Col. 11, line 43, change last word "bottom" to -- bottom- --.

Signed and Sealed this

Twenty-sixth Day of September, 2006

JON W. DUDAS
*Director of the United States Patent and Trademark Office*